United States Patent [19]

Den Hollander et al.

[11] Patent Number: 5,317,261
[45] Date of Patent: May 31, 1994

[54] VOLUME-SELECTIVE MAGNETIC RESONANCE IMAGING METHOD AND DEVICE

[75] Inventors: Jan A. Den Hollander; Peter R. Luyten; Reurt P. Van Stapele, all of Eindhoven, Netherlands

[73] Assignee: U.S. Philips Corporation, New York, N.Y.

[21] Appl. No.: 881,906

[22] Filed: May 12, 1992

[30] Foreign Application Priority Data

May 27, 1991 [EP] European Pat. Off. ......... 91201254.9

[51] Int. Cl.$^5$ ............................................. G01V 3/00
[52] U.S. Cl. .................................... 324/309; 324/307
[58] Field of Search ............... 324/300, 307, 309, 310, 324/311, 312, 314

[56] References Cited

U.S. PATENT DOCUMENTS

| | | | |
|---|---|---|---|
| 4,480,228 | 10/1984 | Bottomley | 324/309 |
| 4,879,514 | 11/1989 | Mehikopf et al. | 324/309 |
| 5,034,693 | 7/1991 | McKinnon et al. | 324/309 |
| 5,111,143 | 5/1992 | McKinnon et al. | 324/309 |
| 5,121,059 | 6/1992 | Wieland | 324/309 |

OTHER PUBLICATIONS

Journal of Magnetic Resonance 59, (1984) "Highly Selective $\pi/2$ and $\pi$ Pulse Generation" Silver et al, pp. 347–351 (no month).
Journal of Magnetic Resonance 84, (1989) "A Perfect Spin Echo in a Weakly Homonuclear J–Coupled Two Spin ½ System" Takegoshi et al pp. 611–615 (no month).
"Nuclear Magnetic Resonance Spectroscopy" R. K. Harris, (1987) "The Fundamentals" pp. 1–35 (no month).

*Primary Examiner*—Louis Arana
*Attorney, Agent, or Firm*—Jack D. Slobod

[57] ABSTRACT

A volume-selective magnetic resonance method for the determination of an MRI spectrum MR image, comprises a 90° excitation pulse ($p_0$) followed by two 180° pulses ($p_1$, $p_2$,) the pulses ($p_0$, $p_1$, $p_2$) being slice-selective. The magnetic resonance signal (SE) is sampled in the absence of magnetic field gradients and a spectrum is determined by way of Fourier transformation.

In comparatively simple spin systems, J-refocusing is achieved for a specific choice of the echo time (TE), while only one J-coupling of more complex spin systems, comprising more than on J-coupling, is refocused by a specific choice of the echo time (TE).

The method in accordance with the invention applies either a chemically selective 180° pulse ($p_3$) or a broadband 90° pulse ($p_4$) between the 180° pulses ($p_1$, $p_2$). This causes J-refocusing to then occur, regardless the selected echo time (TE).

8 Claims, 3 Drawing Sheets

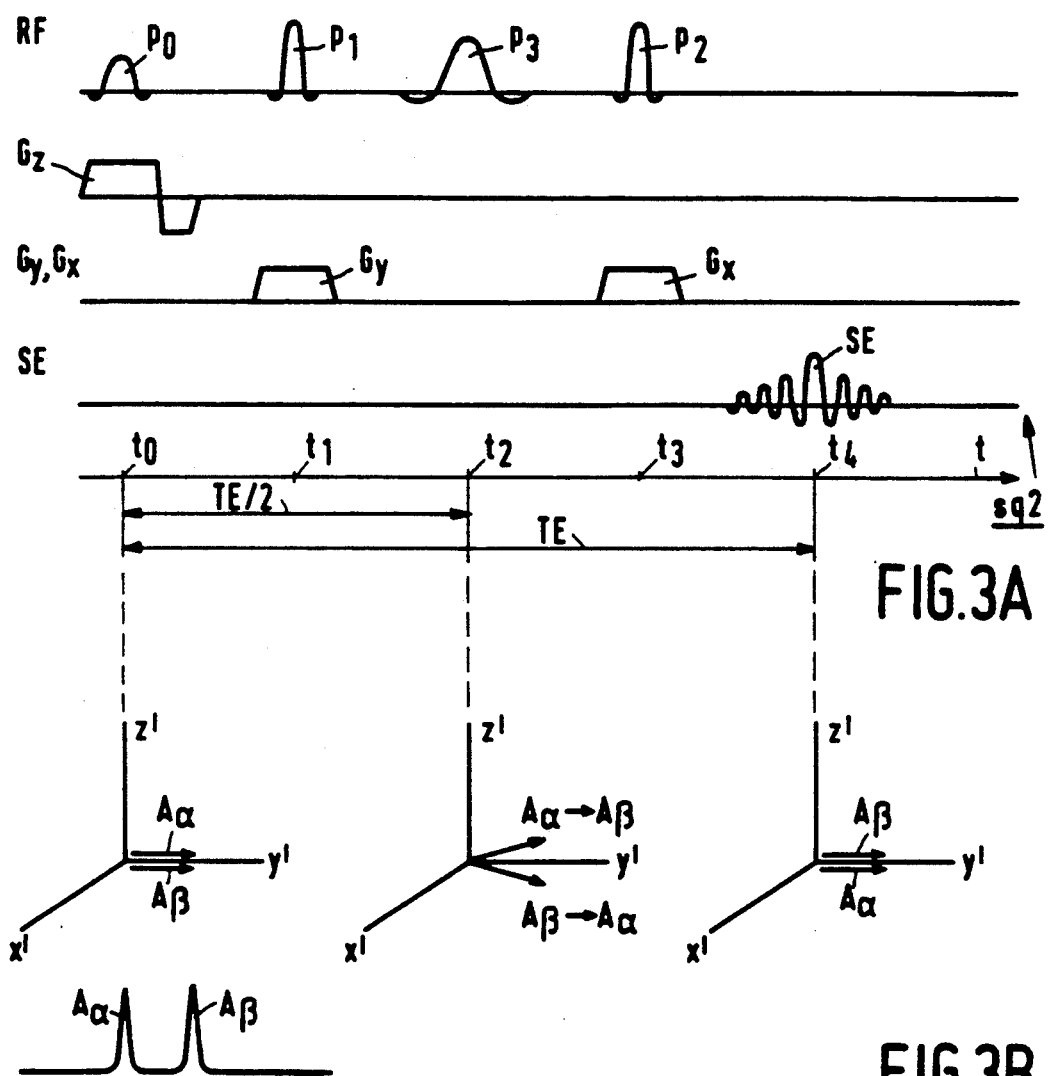
FIG.3A
FIG.3B
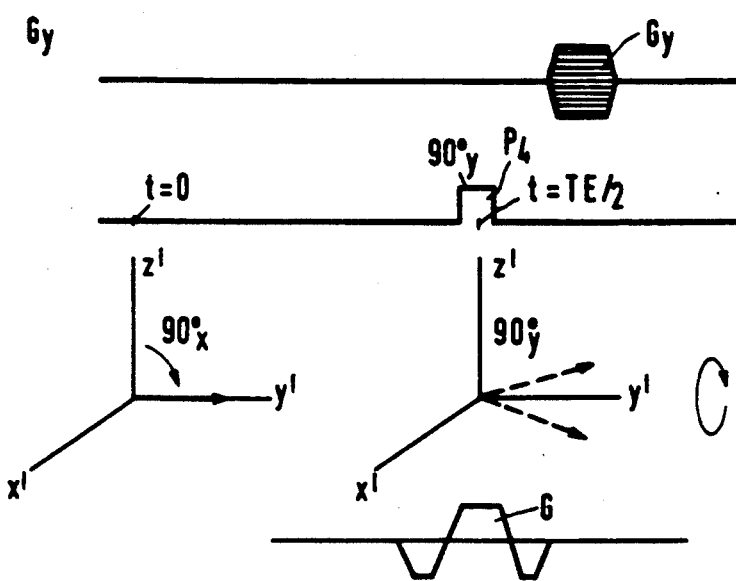
FIG.3C
FIG.3D

VOLUME-SELECTIVE MAGNETIC RESONANCE IMAGING METHOD AND DEVICE

BACKGROUND OF THE INVENTION

1. Field of the Invention

The invention relates to a volume-selective magnetic resonance method for determining a spectrum or a spectroscopic image of a region of an object which is arranged in a steady, uniform magnetic field, a volume-selective pulse and gradient sequence being applied to the region of the object in order to generate magnetic resonance signals, which sequence comprises a 90° excitation pulse followed by a first and a second 180° pulse, a magnetic field gradient superposed on the steady field being applied during at least one of the pulses in order to obtain volume-selective resonance signals.

The invention also relates to the use of such a method.

The invention also relates to a magnetic resonance device for volume-selective magnetic resonance spectroscopy or spectroscopic imaging, comprising means for generating a steady, uniform magnetic field, transmitter means for transmitting RF electromagnetic pulses to an object arranged in the steady field, means for generating magnetic field gradients superposed on the steady field, and receiver and processing means for receiving and processing magnetic resonance signals generated in the object, which processing means comprise programmed means which are operative to apply pulse and gradient sequences to the object in order to generate volume-selective magnetic resonance signals, which sequences comprise a 90° excitation pulse followed by a first and a second 180° pulse, at least one of which is volume-selective.

2. DESCRIPTION OF THE PRIOR ART

A volume-selective magnetic resonance method of this kind is known from EP-A 0 106 226, which corresponds to U.S. Pat. No. 4,480,228. According to such a method, an object is exposed to a slice-selective 90° pulse, i.e. an RF pulse in the presence of a magnetic field gradient superposed on the steady field, after which it is exposed to slice-selective 180° pulses, the respective gradient directions thereof extending mutually perpendicular. A magnetic resonance signal is thus obtained from a region of the object. The so-called spin-echo resonance signal arising after the second 180° pulse is observed in the absence of gradients and is subsequently subjected to a Fourier transformation so that a localized spectrum is obtained from the region of the object.

Even though inhomogeneities in the steady field are refocused by means of the known so-called spin-echo method, the known method has the drawback that neat refocusing is not obtained for mutually weakly coupled nuclei in a molecule of the object, the so-called J-coupling. For example, in order to make a doublet visible in a molecule in which a group is weakly coupled to a proton in the molecule, a specific choice of the echo time is necessary. In the case of more complex molecules with different Js, a large number of couplings exists and one coupling can be made visible by a specific choice of the echo time. An example of such a more complex molecule is glutamate.

SUMMARY OF THE INVENTION

It is an object of the invention to mitigate such a drawback.

A method in accordance with the invention is characterized in that for the refocussing of J-coupling between nuclei in a molecule of the object a chemically selective pulse or a broadband 90° pulse is applied between the first and the second 180° pulse.

When a chemically selective pulse is applied, it restores the refocusing of the J-coupling disturbed by the first 180° pulse. The first slice-selective 180° pulse refocuses the effect of phase differences due to differences in chemical shift but not due to J-coupling, the chemically selective, soft pulse, preferably being a soft 180° pulse, refocusing the J-coupling. The chemical shift refocusing is then independent of the J-refocusing.

So-called 2D-J-resolved spectroscopy is known, but concerns time-consuming and complex methods from so-called high-resolution spectroscopy which are not suitable for in vivo spectroscopy.

When a broadband 90° pulse is applied, being a hard pulse exciting the entire volume and being phase shifted 90° relative to the excitation pulse, non-coupled spins will not experience this broadband pulse. The J-coupled spins, being defocused or dephased due to J-modulation, however, do experience the broadband pulse. At the instant of echo a J-refocused signal then appears.

The occurrence of a J-refocused signal is known per se from an article in Journal of Magnetic Resonance, Vol. 84, pp. 611-615 (1989). The cited article describes experiments for execution in a high-resolution spectrometer. The article does not contain references to in vivo spectroscopy or to volume-selective spectroscopy where problems of another kind occur.

In the embodiment comprising the chemically selective pulse, the chemically selective pulse is preferably an amplitude and frequency-modulated pulse, being a so-called hyperbolic secant pulse. This results in a neat profile, notably when use is made of a surface coil.

In the embodiment comprising the broadband 90° pulse, preferably phase cycling is applied, i.e. the sequence is repeated with the broadband 90° pulse phase shifted 180°, the magnetic resonance signals obtained from both sequences being summed. It has been found that the use of phase cycling is necessary for practical reasons because of the broadband 90° pulse which generates signals in the slice defined by the second 180° pulse. By phase cycling it is achieved that undesirable signals in this slice are cancelled outside the desired volume to be selected. The broadband 90° pulse is preferably slice-selective, so that a minimum amount of undesirable signals is generated. When a hyperbolic secant pulse is used, phase cycling can be dispensed with, because spurious signals will then be situated outside the region of spectral importance, i.e. they will occur in another part of the spectrum.

A further version of a method in accordance with the invention is characterized in that prior to the last 180° pulse phase encoding is applied in one, two or three directions in order to obtain magnetic resonance signals for the spectroscopic image. A spectroscopic image represents the occurrence of given chemical compounds in the object over a wider range than a volume element. Anatomic information can thus be coupled to chemical information.

The method in accordance with the invention can be advantageously used for spectroscopy of neurotransmitters. This concerns comparatively complex molecules which play an important role in the transfer of signals in the brain of a human or animal object. Neurotransmitters of this kind are, for example glutamate, glutamine, taurine and γ-aminobutyric acid.

The method in accordance with the invention is preferably used for protons, but can also be applied to other nuclei such as phosphor.

BRIEF DESCRIPTION OF THE DRAWING

The invention will be described in detail hereinafter with reference to a drawing; therein:

FIG. 3A shows a pulse and gradient sequence in accordance with the invention, FIG. 3B shows J-refocusing by means of the pulse and gradient sequence in accordance with the invention, FIG. 3C shows an extension of the pulse and gradient sequence in accordance with the invention in order to obtain magnetic resonance signals for a spectroscopic image, and FIG. 3D shows a modification of the pulse and gradient sequence in accordance with the invention.

DESCRIPTION OF THE PREFERRED EMBODIMENT

Figure 1:
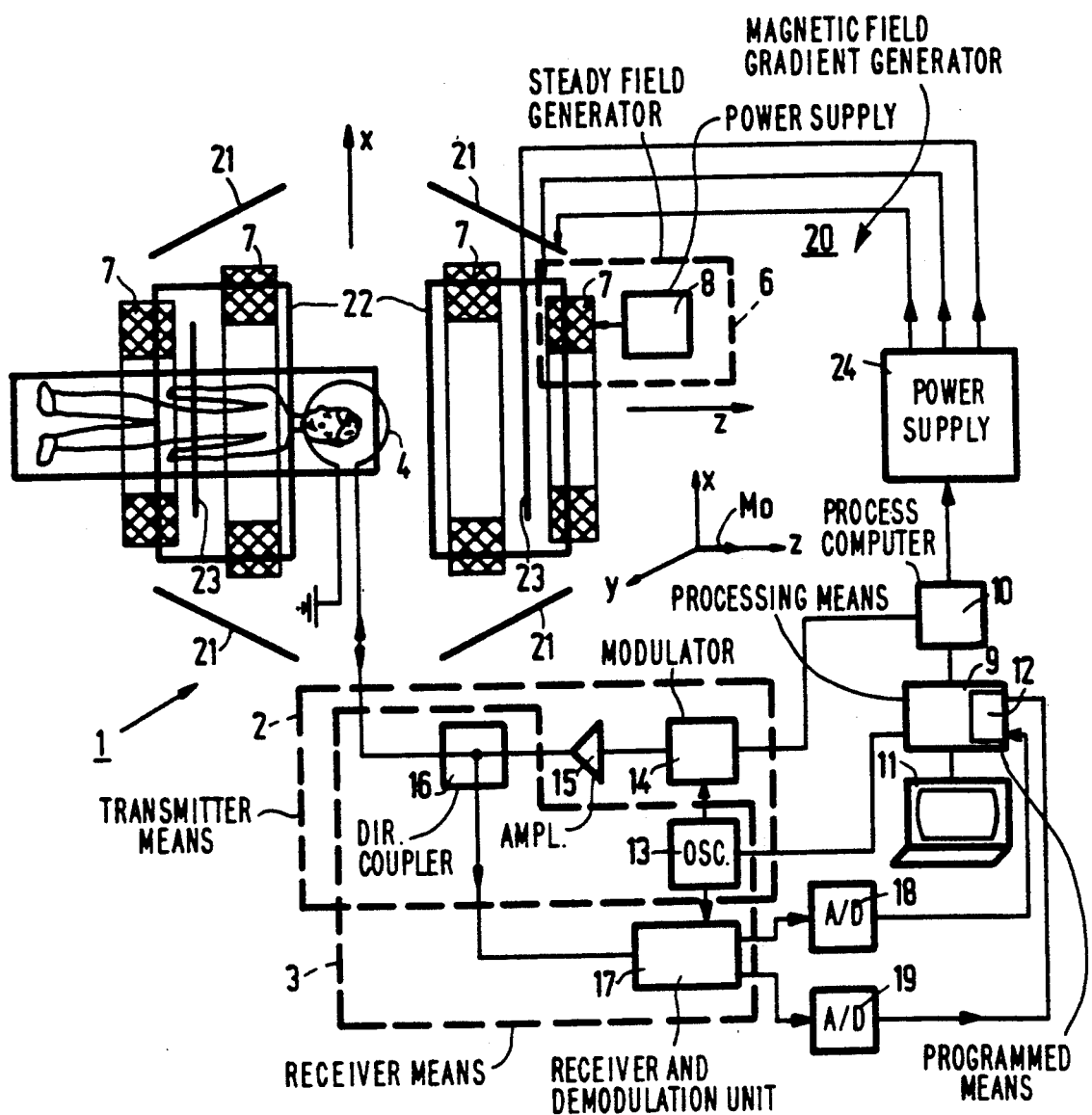
FIG. 1 shows diagrammatically a magnetic resonance device in accordance with the invention.

FIG. 1 shows diagrammatically a magnetic resonance device 1 in accordance with the invention, comprising transmitter means 2 and receiver means 3 for transmitting RF electromagnetic pulses, via a transmitter/receiver coil 4, to an object 5 and for receiving magnetic resonance signals, respectively, which are generated by the RF electromagnetic pulses in the object 5 which is arranged in a steady, uniform magnetic field. The transmitter/receiver coil 4 may be a single coil, but may also consist of a separate transmitter coil and a separate receiver coil which may be constructed as a surface coil, if desired. The device 1 comprises means 6 for generating the steady field. The means 6 comprise magnet coils 7 and, in the case of resistive magnets or superconducting magnets, a DC power supply 8. The DC power supply 8 is absent in the case of a permanent magnet. During operation of the device 1 with the object arranged within the magnet coils 7, a slight excess of nuclear spins (of nuclei having a magnetic moment) will be directed in the direction of the steady field in a state of equilibrium. From a macroscopic point of view this is to be considered as a magnetization $M_0$, being an equilibrium magnetization. The device 1 furthermore comprises processing means 9 which are coupled to the transmitter means 2 and the receiver means 3, a process computer 10 which is coupled to the processing means 9 and the transmitter means 2, and display means 11 for displaying a nuclear magnetization distribution which is determined, using programmed means 12, from the resonance signals received by the receiver means 3, after demodulation and signal sampling (detection of resonance signals). More specifically, the transmitter means 2 comprise an RF oscillator 13 for generating a carrier signal, a modulator 14 for amplitude and/or phase and frequency modulation of the carrier signal, a power amplifier 15, and a directional coupler 16 which is coupled to the transmitter/receiver coil 4. The RF oscillator 13 is coupled to the processing means 9 and the modulator 14 is coupled to the process computer 10. When, under the control of the programmed means 12 and via the transmitter means 2, excitation pulses are radiated to the object 5 having a frequency content approximately around to the so-called Larmor frequency of, for example, protons, magnetic resonance signals will arise wherefrom a proton nuclear spin distribution can be determined by the programmed means 12, for example by way of Fourier transformation. Radiation to other nuclei is also possible, for example to phosphor. The receiver means 3 for receiving the resonance signals comprise the directional coupler 16 and a receiver and demodulation unit 17. The unit 17 may be a double phase-sensitive detector whose output signals are sampled by means of a first and a second analog-to-digital converter 18, 19, respectively. The A/D converters 18 and 19 are coupled to the processing means 9. The transmitter and receiver means 2, 3 may alternatively be formed by a so-called phase-coherent digital transmitter/receiver. The device 1 furthermore comprises means 20 for generating magnetic field gradients superposed on the steady, uniform field. The means 20 comprise gradient magnet coils 21, 22 and 23 for generating magnetic field gradients $G_x$, $G_y$ and $G_z$, respectively, and a power supply 24 which is controlled by the process computer 10 and which serves to power the gradient magnet coils 21, 22 and 23 which are separately activatable. In the embodiment shown the arrangement in space of the gradient magnet coils is such that the field direction of the magnetic field gradients coincides with the direction of the steady, uniform magnetic field and that the gradient directions extend mutually perpendicularly as denoted by three mutually perpendicular axes x, y and z in FIG. 1. The magnetic resonance signals wherefrom a nuclear spin distribution can be reconstructed by way of Fourier transformation are obtained by means of so-called pulse and gradient sequences.

Figure 2A:
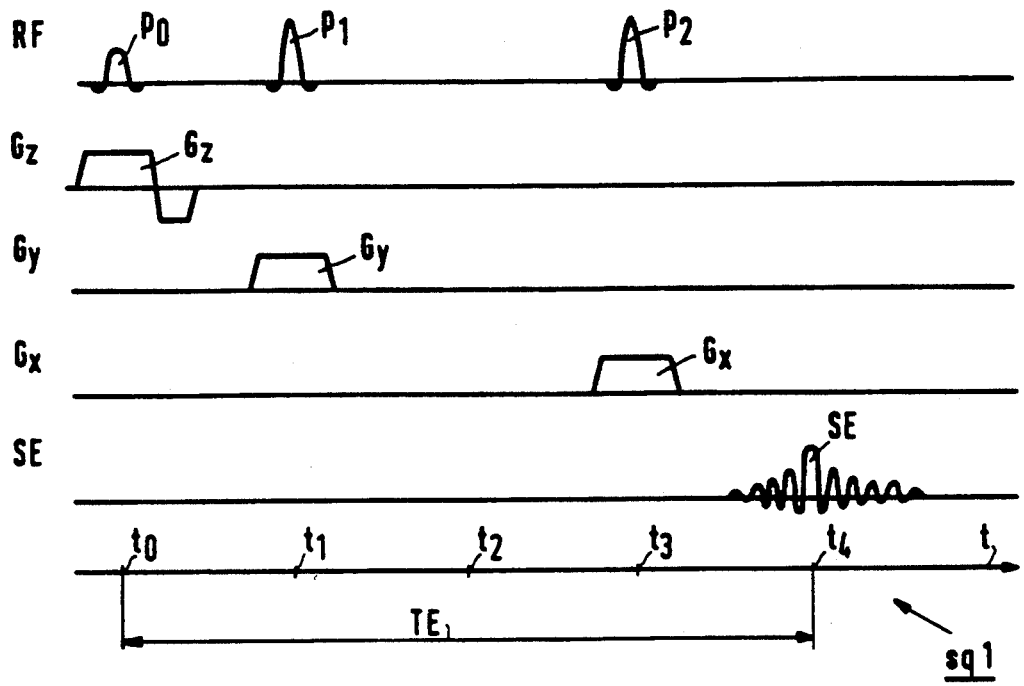
FIG. 2A shows a known pulse and gradient sequence for volume-selective spectroscopy.

FIG. 2A shows a known pulse and gradient sequence sq1 for volume-selective spectroscopy as a function of time t, together with some instants $t_0$, $t_1$, $t_2$, $t_3$ and $t_4$, RF electromagnetic pulses RF which are applied by the transmitter means 2, via the transmitter coil 4, to the object 5 under the control of the programmed means 12, gradients $G_x$, $G_y$ and $G_z$ which are superposed on the steady field by the means 20, and also a spin-echo resonance signal SE which is received by the receiver means 3 and is demodulated, after which it is received by the A/D converters which sample the demodulated signal SE, the samples being processed by the processing means 9. At the instant $t=t_0$ an excitation pulse $p_0$ is applied to the object 5, at the same time there being applied a magnetic field gradient $G_z$ so that a slice of nuclear spins is excited. The subsequently dephasing nuclear spins are refocused at the instant $t=t_1$ by means of a first 180° refocusing pulse $p_1$, at the same time there being applied a magnetic field gradient $G_y$ whose direction extends perpendicular to the direction of the gradient $G_z$. Refocusing occurs at the instant $t=t_2$. After one more selective refocusing by means of a second 180° refocusing pulse $p_2$ while applying a gradient $G_x$ at the instant $t=t_3$, a volume-selective resonance signal SE appears at the instant $t=t_4$. The time interval from $t=t_0$ to $t=t_4$ is referred to as the so-called echo time TE. By sampling the resonance signal SE in the absence of magnetic field gradients, chemical shift information is extracted from the selected region of the object 5. For a more detailed description of the known sequence sq1, reference is made to the cited EP-A 0 106 226 or the corresponding U.S. Pat. No. 4,480,228.

Figure 2B:
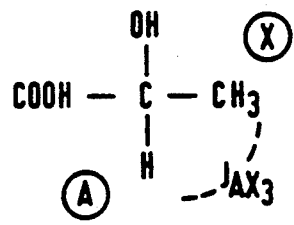
FIG. 2B shows a lactate molecule in which J-coupling between a methyl group and a proton is indicated.
Figure 2C:
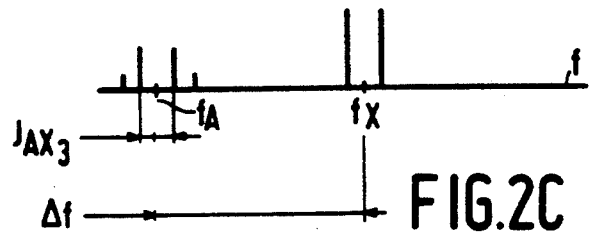
FIG. 2C shows a spectrum of a lactate molecule.

FIG. 2B shows a lactate molecule in which J-coupling is indicated between a methyl group and a proton. Lactate molecules of this kind are of significance inter alia in metabolic processes in a human or animal object 5. In order to extract as much information as possible of such in vivo processes and also of other in vivo processes in which more complex molecules are of significance, it is important to determine spectra as much as possible. Even though the known sequence sq1 refocuses chemical shift, but neat refocusing of J-couplings is not obtained. This is more significant as the modecules are more complex and comprise several J-couplings. For example, for proton spectra of an object the so-called Larmor equation holds good, which equation states that the magnetic resonant frequency is proportional to the steady field. However, the resonant frequency is also dependent on the chemical environment of the proton. As an effect of shielding by electron clouds, in relation to resonance, is that an effective field may be felt which is smaller than the applied steady field, so that a shift of resonant frequency occurs which is dependent on a given shielding, i.e. the so-called chemical shift; in other words, the various chemical environments of inter alia a proton can be distinguished by MR spectroscopy. The chemical shift is expressed in ppm (parts per million), i.e. in Hz relative to the frequency of the MR device. Within a molecule weak couplings may also occur between protons in the molecule, as in the given example for lactate between a methyl group $-CH_3$ and a proton $-H$, represented in FIG. 2B by J, being the so-called J-coupling constant. This so-called J-coupling expresses interaction between nuclear spins and gives rise to spectral splitting in a magnetic field. The coupling constant J depends on the chemical environment but not on the frequency of the MRI device. Therefore, spectral splitting is expressed in Hz. In relation to spectral splitting so-called spin-$\frac{1}{2}$ systems are usually denoted by letter combinations, such as AX system, AMX system etc. When the difference in chemical shift between a pair of nuclei is such greater than the J-coupling constant, letters are chosen which are situated far apart in the alphabet. Furthermore, indices are used to indicate given symmetries. Lactate is an example of an $AX_3$ system in which the chemical shift is much greater than the coupling constant J. Furthermore, spin states are labelled by the letter $\alpha$ for spin-up and $\beta$ for spin-down. FIG. 2C shows the spectrum of an $AX_3$ system where the chemical shift between the nuclei is $\Delta f = f_A - f_X >> J$. The frequency axis f therein extends from left to right from higher to lower frequencies. The spectrum contains a doublet and a quartet. For a more detailed description of spin systems reference is made to the handbook "Nuclear Magnetic Resonance Spectroscopy", R. K. Harris, Longman Scientific & Technical, 1987, ISBN 0-582-44653-8, notably to chapter 1 "The fundamentals", pp. 1–35.

Figure 2D:
FIGS. 2D, 2E and 2F show J-refocusing of a doublet in a spectrum by means of the known pulse and gradient sequence for different echo times.
Figure 2E:
Figure 2F:
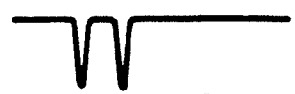

FIGS. 2D, 2E and 2F show J-refocusing of a doublet in a spectrum, using the known pulse and gradient sequence sq1 with different echo times TE. In FIG. 2D is chosen $TE=2/J$ and $TE=1/J$ is chosen in FIG. 2F; in FIG. 2E the choice of TE results in the reversal of the sign of one resonance peak and the sign of the other resonance peak remaining the same. Even in the simple case of a lactate molecule a specific choice of the echo time TE is necessary for neat refocusing of the doublet. For more complex molecules with different J-couplings, only one of the many J-couplings can be solved by a specific choice of the echo time.

FIG. 3A shows a pulse and gradient sequence sq2 in accordance with the invention as a function of time t, quantities corresponding to FIG. 2A being denoted by the same references. In a first version of a method in accordance with the invention, a 180° pulse $p_3$ which is, for example chemically selective on protons, is applied to the object 5 at the instant $t=t_2$, halfway the echo time TE, i.e. at TE/2. The pulse $p_3$ realizes neat J-refocusing, regardless of the echo time TE chosen. The chemical shift refocusing occurs independently thereof. The method in accordance with the invention is effective not only for a comparatively simple J-coupling as in the case of lactate, but also for more complex molecules and associated J-coupling such as for neurotransmitters which are important in the transfer of signals in the brain of a human or animal object 5. Neurotransmitters of this kind are, for example glutamate, glutamine, taurine and $\gamma$-aminobutyric acid. For a thorough understanding of such signal transfer processes it is important to determine such neurotransmitters quantitatively in a spectrum or in a spectroscopic image. The presence or absence of tumors can be deduced in vivo from the relative quantities of inter alia neurotransmitters.

FIG. 3B shows J-refocusing by means of the pulse and gradient sequence sq2 in accordance with the invention, the J-refocusing of the A-group in an AX system being shown by way of example. At the instant $t=t_0$, the $A_\alpha$ and $A_{62}$ magnetization are in phase. This is shown in a rotating system of coordinates $x'y'z'$ in FIG. 3B. The pulse $p_3$ at the instant $t_2$ reverses the magnetizations as shown in the system $x'y'z'$ at the instant $t=t_2$, thus cancelling reversal of the sign by the hard pulse $p_2$. Neat J-refocusing occurs at the instant $t=t_3$. Such refocusing also holds good for more complex molecules and J-couplings. In order to achieve suitable refocusing, it is necessary to apply the pulse $p_3$ at TE/2. FIG. 3B also shows an A-doublet.

The pulse $p_3$ is preferably applied as an amplitude and frequency modulated pulse, being a so-called hyperbolic secant pulse. The method in accordance with the invention can thus also be effectively used in conjunction with surface coils. The modulator 14 is then controlled by the programmed means 12 so that the pulses $p_0$, $p_1$ and $p_2$ are amplitude modulated and the pulse $p_3$ is amplitude and frequency modulated. It is then necessary for the transmitter and receiver means 2, 3 to form a phase-coherent digital transmitter/receiver. A digital synthesizer included therein undergoes a frequency swing during application of the pulse $p_3$ and the resultant signal is amplitude modulated.

For a further description of hyperbolic secant pulses reference is made to an article "Highly Selective $\pi/2$ and $\pi$ Pulse Generation", M. S. Silver et al., JMR, Vol. 59, 1984, pp. 347–351 and for a further description of a phase-coherent transmitter/receiver reference is made to U.S. Pat. No. 4,879,514.

FIG. 3C shows an extension of the pulse and gradient sequence sq2 in accordance with the invention in order to obtain magnetic resonance signals for a spectroscopic image. The Figure shows a phase encoding gradient $G_y$ which is applied to the object 5, between the pulses $p_3$ and $p_2$, by way of the means 20. The sequence sq2 is repeated with different amplitudes of the phase encoding gradient $G_y$. The processing means 9 reconstruct a spectroscopic image from a set of sampled resonance signals. Phase encoding can also be applied in the z direction and the x direction. After reconstruction, one-dimensional, two-dimensional or three-dimensional spectroscopic images, respectively, are obtained which can be displayed by means of the display means 11, for example in colour hues representing the spectroscopic information.

FIG. 3D shows a modification of the pulse and gradient sequence sq2 in accordance with the invention. Instead of a soft 180° pulse $p_3$, at the instant $t=t_2$ a hard 90° pulse, being a broadband pulse, is applied to the object 5, which pulse excites nuclear spins in a non-selective manner. If the pulse $p_0$ is an x-pulse, the pulse $p_4$ is a y-pulse, so that the non-coupled nuclear spins do not experience the pulse $p_4$ but the J-coupled spins do experience this pulse. In that case neat J-refocusing occurs at $t=t_4$. The foregoing is shown in the system x'y'z' at the instants $t=t_0$ and $t=t_2$. At $t=t_2$, the non-coupled spins have been rephased again after initial dephasing but not the J-coupled spins. The pulse $p_4$ may also be slice-selective. From a practical point of view, in the 90° version phase cycling is desired for the suppression of undesirable signals. The pulse sequence sq2 is repeated with a modification of the phase of the 90° pulse $p_4$ whose phase is then shifted through 180°. The respective resonance signals are summed, so that desired signals are maintained and undesired signals are eliminated. Such phase cycling may be dispensed with in the version involving the soft 180° pulse.

We claim:

1. A volume-selective magnetic resonance method for determining one of a spectrum and a spectroscopic image of a region of an object which is arranged in a steady, uniform magnetic field, said method comprising applying a volume-selective pulse and gradient sequence to the region of the object to generate magnetic resonance signals, which sequence comprises a 90° excitation pulse followed by first and second 180° pulses, a magnetic field gradient superposed on the steady magnetic field during at least one of the pulses in order to obtain volume-selective resonance signals and one of a chemically selective amplitude and frequency modulated pulse and a broadband 90° pulse between the first and second 180° pulses for refocusing a J-coupling between nuclei in a molecule of the object.

2. A volume-selective magnetic resonance method as claimed in claim 1 wherein the chemically selective pulse is a 180° pulse which is applied a time after the excitation pulse which is equal to one half echo time of an echo resonance signal after the second 180° pulse.

3. A volume-selective magnetic resonance method as claimed in claim 1 wherein when the broadband 90° pulse is applied, the time interval between the excitation pulse and a first echo time after the first 180° pulse is equal to the time interval between the first echo time and and a second echo time after the second 180° pulse.

4. A volume-selective magnetic resonance method as claimed in claim 3 including one of the steps of applying phase cycling and rendering the broadband 90° pulse slice-selective by a magnetic field gradient.

5. A volume-selective magnetic resonance method as claimed in any one of the preceding claims including applying one of before or after the last 180° pulse phase encoding in one of one, two and three directions to obtain magnetic resonance signals for the spectroscopic image.

6. The method as claimed in claim 5 including using volume-selective magnetic resonance imaging for spectroscopy of neurotransmitters.

7. A volume-selective magnetic resonance method as claimed in claim 1, wherein said one of a chemically selective amplitude and frequency modulated pulse and a broadband 90° pulse between the first and second 180° pulses is a broadband 90° pulse.

8. A magnetic resonance imaging device for one of volume-selective magnetic resonance spectroscopy or spectroscopic imaging, comprising means for generating a steady uniform magnetic field, transmitter means for transmitting RF electromagnetic pulses to an object arranged in the steady magnetic field, transmitter means for transmitting RF electromagnetic pulses into said object, means for generating magnetic field gradients superposed on the steady field, and receiver and processing means for receiving and processing magnetic resonance signals generated in the object, which processing means comprises programmed means operative to apply pulse and gradient sequences to the object to generate volume-selective magnetic resonance signals, which sequences comprise a 90° excitation pulse followed by first and second 180° pulses, at least one of which is volume selective, said programmed means including means operative to apply, to achieve refocussing of a J-coupling between nuclei in a molecule of the object, one of a chemically selective amplitude and frequency modulated pulse and a broadband 90° pulse between the first and second 180° pulses.

* * * * *